(12) United States Patent
Chang

(10) Patent No.: US 6,181,213 B1
(45) Date of Patent: Jan. 30, 2001

(54) PHASE-LOCKED LOOP HAVING A MULTI-PHASE VOLTAGE CONTROLLED OSCILLATOR

(75) Inventor: Horng-Der Chang, Hsinchu (TW)

(73) Assignee: Realtek Semiconductor Corp., Hsinchu (TW)

( * ) Notice: Under 35 U.S.C. 154(b), the term of this patent shall be extended for 0 days.

(21) Appl. No.: 09/332,068

(22) Filed: Jun. 14, 1999

(51) Int. Cl.[7] ............... H03L 7/099; H03L 7/18; H03B 29/00
(52) U.S. Cl. ............... 331/34; 331/16; 331/25; 331/57; 331/78; 327/156
(58) Field of Search ............... 331/16, 18, 25, 331/34, 45, 57, 78; 327/156–159

(56) References Cited

U.S. PATENT DOCUMENTS

| | | | |
|---|---|---|---|
| 4,035,833 | * 7/1977 | Shepard | 358/10 |
| 5,889,436 | * 3/1999 | Yeung et al. | 331/2 |
| 5,994,933 | * 11/1999 | Yamanaka et al. | 327/158 |

* cited by examiner

Primary Examiner—David Mis
(74) Attorney, Agent, or Firm—Bacon & Thomas, PLLC

(57) ABSTRACT

The present invention provides a phase-locked loop having a multi-phase voltage controlled oscillator. The phase-locked loop comprises a divided-by-N counter, a divided-by-M counter, a phase frequency detector, a charge pump, a loop filter, a multi-phase voltage controlled oscillator, a switching unit, and a clock counter. It utilizes a multi-phase voltage controlled oscillator instead of a conventional voltage controlled oscillator and a switching unit is used to select the output signal from the multi-phase voltage controlled oscillator. The switching time of the switching unit is controlled by the clock counter to achieve the effect of frequency expansion.

3 Claims, 4 Drawing Sheets

PHASE-LOCKED LOOP HAVING A MULTI-PHASE VOLTAGE CONTROLLED OSCILLATOR

FIELD OF THE INVENTION

The present invention relates generally to a phase-locked loop, and more particularly, to a phase-locked loop that utilizes a multi-phase voltage controlled oscillator to achieve frequency expansion effect.

BACKGROUND OF THE INVENTION

In the clock synthesizer of a mainboard, a phase-locked loop is often utilized to perform data recovery. Moreover, some modifications are often made to a phase-locked loop so that it has frequency expansion capability for reducing electromagnetic interference (EMI). However, there is no simple way to achieve frequency expansion in conventional phase-locked loops.

FIG. 1 illustrates a conventional phase-locked loop comprising a divided-by-N counter 11, a divided-by-M counter 12, a phase frequency detector 13, a charge pump 14, a loop filter 15, and a voltage controlled oscillator 16.

The divided-by-N counter 11 outputs a clock signal with frequency 1/N that of its input clock signal (i.e. $f_{xtal}$), which will be denoted by $f_{xtal}/N$ in the following.

FIG. 2 illustrates the cases that the frequency $f_{xtal}$ is reduced to ½ and ⅓ of its original frequency respectively. The divided-by-M counter 12 outputs a clock signal with frequency 1/M that of its input clock signal (i.e. $f_{vco}$), which will be denoted by $f_{vco}/M$ in the following. The phase frequency detector 13 compares the signals $f_{xtal}/N$ and $f_{vco}/M$, outputs signals which are determined by the frequency difference and phase difference of the two signals $f_{xtal}/N$ and $f_{vco}/M$. As shown in FIG. 3(a), when the phase of $f_{vco}/M$ lags behind that of $f_{xtal}/N$ (as denoted in the figure by dotted lines), the phase frequency detector 13 outputs an 'up' signal. On the other hand, as shown in FIG. 3(b), when the phase of $f_{vco}/M$ is ahead of that of $f_{xtal}/N$ (as denoted in the figure by dotted lines), the phase frequency detector 13 outputs an 'dn' signal. Referring to FIG. 4, the charge pump 14 and the loop filter 15 cooperatively convert the 'up' and 'dn' signals outputted from the phase frequency detector 13 into a voltage signal Vc. When the phase frequency detector 13 outputs an 'up' signal, the output voltage Vc of the loop filter 15 is increased. On the other hand, when the phase frequency detector 13 outputs an 'dn' signal, the output voltage Vc of the loop filter 15 is decreased. The voltage controlled oscillator 16 outputs a clock signal with frequency $f_{vco}$ determined by the output voltage Vc of the loop filter 15. The frequency $f_{vco}$ increases as voltage Vc increases, and decreases as voltage Vc decreases.

As describe above, when the phase-locked loop is in a phase-locked state, the phase of $f_{xtal}/N$ is in alignment with that of $f_{vco}/M$ and the frequencies of these two clock signals are the same, as shown in FIG. 5. In other words, $f_{vco}=(M/N) \times f_{xtal}$. It can be seen from this equation that the $f_{vco}$ can be determined by M and N.

The concept of frequency expansion is described in the following. Assume that clock signals with some fixed frequency is desired, then clock signals with frequency varies in a predetermined frequency range centering at that frequency is generated. For example, frequency may vary linearly and periodically in a predetermined frequency range. Referring to FIG. 1, the frequency $f_{vco}$ can be made to vary linearly and periodically by making Vc vary linearly and periodically, which can be achieved by making the 'up' and 'dn' signals vary alternately and periodically. Moreover, the 'up' and 'dn' signals may be made to vary alternately and periodically by adjusting the values of M and/or N. As shown in FIG. 5, while the phase-locked loop 1 is in a phase-locked state, the phase of $f_{xtal}/N$ is in alignment with that of $f_{vco}/M$ and there is no 'up' or 'dn' signal generated. Referring to FIG. 6, when the value of M is suddenly changed to (M+ΔM) or (M−ΔM), the 'up' and 'dn' signals are alternately generated. Similarly, when the value of N is suddenly changed to (N+ΔN) or (N−ΔN), the up' and 'dn' signals are alternately generated as well.

As described above, controlling the value of M (or N) results in the 'up' and 'dn' signals being generated alternately. This, in turn, leads to Vc varying linearly and periodically. Consequently, the value of $f_{vco}$ varies linearly and periodically. FIG. 7 shows the variation of $f_{vco}$ when M varies through a series of increments (ΔM) and then a series of decrements (−ΔM) From the figure, it can be seen that $f_{vco}$ varies linearly and periodically in a predetermined frequency range centering at the frequency f.

From the above description, it can be seen that a phase-locked loop can achieve the effect of frequency expansion by controlling the values of M and N. However, controlling M and N is not easy and may require a complicated circuit.

SUMMARY OF THE INVENTION

It is therefore an object of the present invention to provide a simple phase-locked loop having frequency expansion capability.

The present invention is primarily characterized in that a multi-phase voltage controlled oscillator instead of a conventional voltage controlled oscillator is used in a phase-locked loop and a switching unit is used to select the output signal from the multi-phase voltage controlled oscillator. The switching time of the switching unit is controlled by a clock counter.

To achieve the aforementioned object, a phase-locked loop having a multi-phase voltage controlled oscillator is provided. It includes a divided-by-N counter, a divided-by-M counter, a phase frequency detector, a charge pump, a loop filter, a multi-phase voltage controlled oscillator, a switching unit, and a clock counter wherein, the divided-by-N counter outputs a clock signal with frequency 1/N of its input signal. The divided-by-M counter outputs a clock signal with frequency 1/M of its input signal. The phase frequency detector receives the output signal from the divided-by-N counter and the output signal from the divided-by-M counter, outputs a control signal that is determined by the phase difference and frequency difference between the two received signals. The charge pump receives the control signal outputted from the phase frequency detector. The loop filter is coupled to and cooperates with the charge pump to generate a voltage signal. The multi-phase voltage controlled oscillator receives the voltage signal generated by the loop filter and outputs a plurality of clock signals of the same frequency and different phases, wherein one of the clock signals is used as the output clock signal of the phase-locked loop. The switching unit is connected between the divided-by-M counter and the multi-phase voltage controlled oscillator for selecting a clock signal among the output clock signals from the multi-phase voltage controlled oscillator as the input signal for the divided-by-M counter. The clock counter generates a control signal for controlling the switching time of the switching unit.

From the description in the preceding paragraph, it can be seen that a multi-phase voltage controlled oscillator instead of a conventional voltage controlled oscillator is used in accordance with the present invention. A switching unit is incorporated to select an output signal from the multi-phase voltage controlled oscillator, whose switching time is controlled by a clock counter. Consequently, the frequency expansion effect of the phase-locked loop in accordance with the invention can be achieved by merely a simple modification made to a conventional phase-locked loop.

BRIEF DESCRIPTION OF THE DRAWINGS

The above and other objects and the features and effects of the present invention can be best understood by referring to the following detailed description of the preferred embodiment and the accompanying drawings, wherein.

DETAILED DESCRIPTION OF THE PREFERRED EMBODIMENTS

Figure 8:
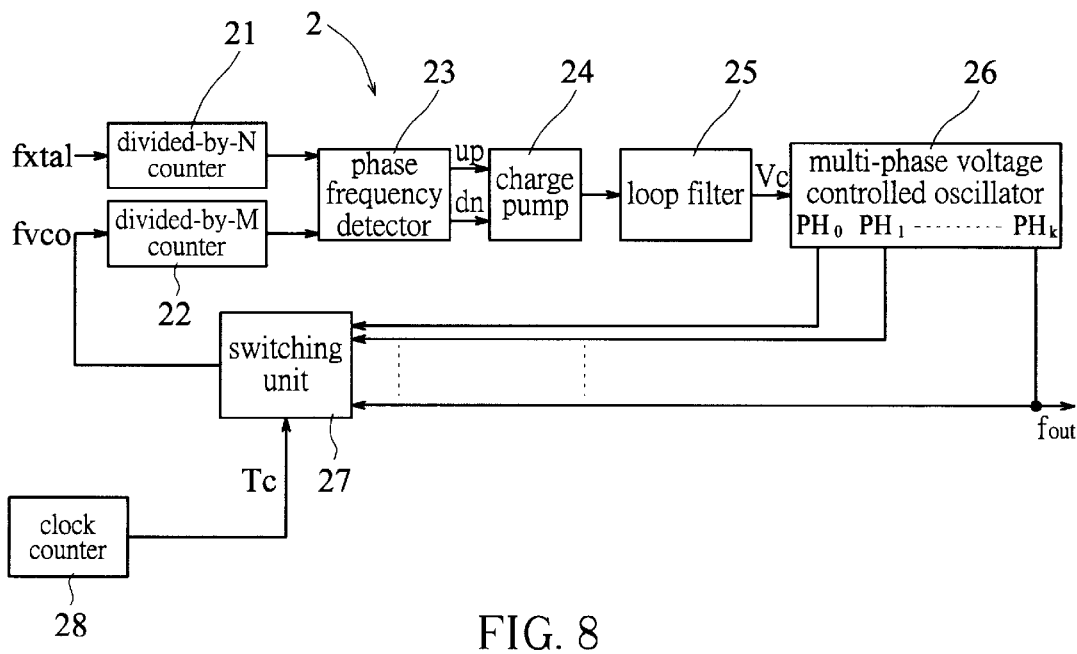
FIG. 8 is the block diagram of a preferred embodiment of the phase-locked loop in accordance with the present invention.

Referring to FIG. 8, a phase-locked loop having a multi-phase voltage controlled oscillator includes: a divided-by-N counter 21, a divided-by-M counter 22, a phase frequency detector 23, a charge pump 24, a loop filter 25, a multi-phase voltage controlled oscillator 26, a switching unit 27, and a clock counter 28.

Among the aforementioned components, the divided-by-N counter 21, the divided-by-M counter 22, the phase frequency detector 23, the charge pump 24, and the loop filter 25 are similar to those in the prior art and will not be described here.

The multi-phase voltage controlled oscillator 26 receives the output voltage Vc from the loop filter 25 and outputs a plurality of periodical signals $PH_0, PH_1, \ldots, PH_k$ of the same frequency and different phases, wherein one of the clock signals is used as the output clock signal of the phase-locked loop.

The switching unit 27 is connected between the divided-by-M counter 22 and the multi-phase voltage controlled oscillator 26 for selecting a clock signal among the output clock signals of the multi-phase voltage controlled oscillator 26 as the input clock signal of the divided-by-M counter 22.

The counter 28 generates a clock control signal Tc for controlling the switching time of the switching unit 27.

A practical example is given in the following to explain how to achieve the effect of frequency expansion by utilizing the multi-phase voltage controlled oscillator 26, the switching unit 27, and the clock counter 28.

Figure 9:
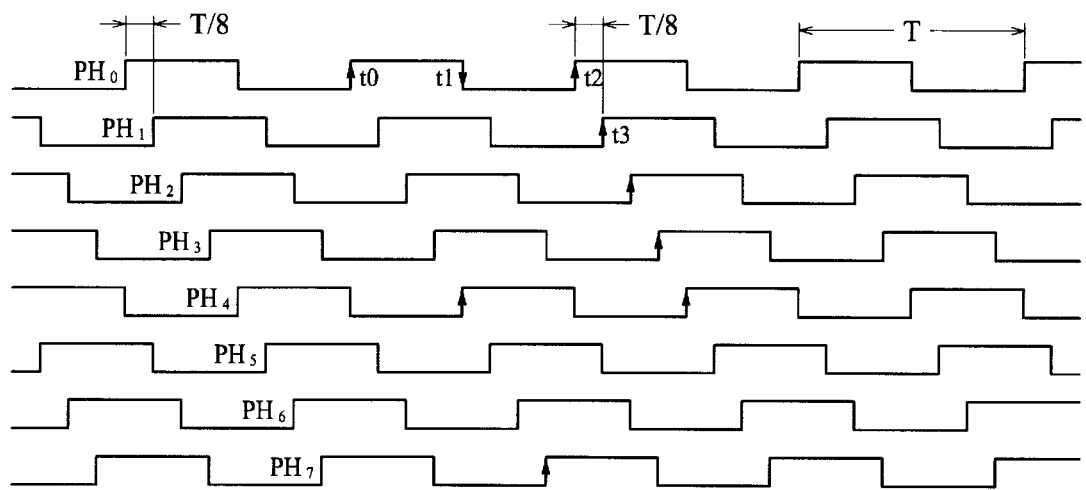
FIG. 9 illustrates the output signals in different phases of the multi-phase voltage controlled oscillator in the phase-locked loop in accordance with the present invention.

In the practical example, the multi-phase voltage controlled oscillator 26 outputs eight clock signals $PH_0, PH_7, \ldots, PH_7$ with the same frequency and different phases, the oscillation period of the multi-phase voltage controlled oscillator is T and the phase difference between two adjacent clock signals is T/8 (as shown in FIG. 9).

The phase frequency detector 23 determines whether the signal $f_{xtal}/N$ lags behind or leads the signal $f_{vco}/M$ according to the rising edges of the input signals. For example, decision is made at time $t_0$ and $t_2$ for the case of $PH_0$. In another aspect, the switching time of the switching unit 27 occurs at falling edges. For example, switching occurs at time $t_1$ for the case of $PH_0$.

Figure 1:
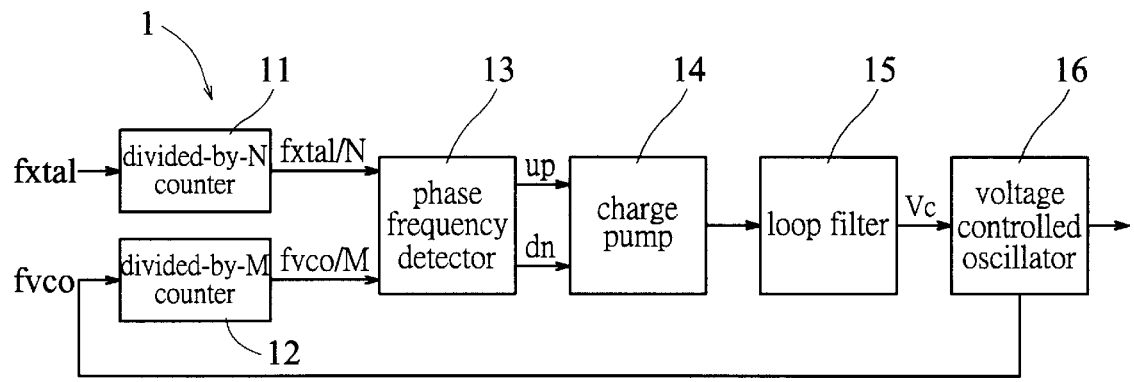
FIG. 1 is the block diagram of a conventional phase-locked loop.
Figure 2:
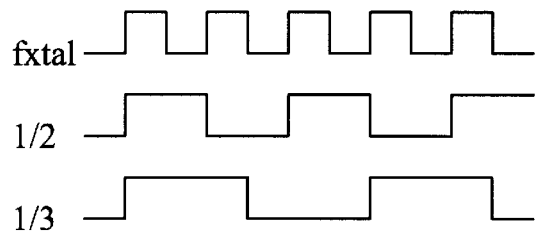
FIG. 2 illustrates the output from a divided-by-N counter which receives an input clock signal $f_{xtal}$.
Figure 4:
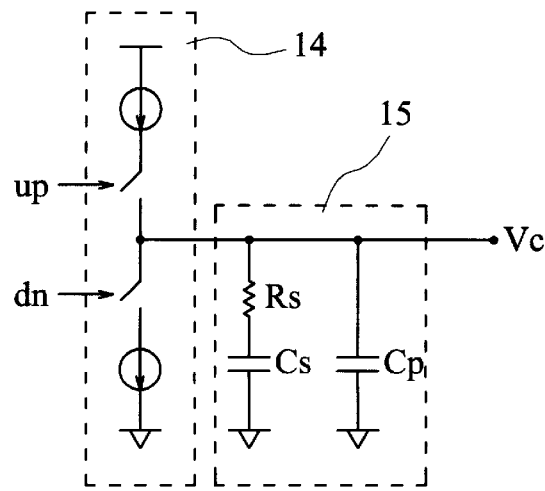
FIG. 4 shows the circuit of a charge pump and a loop filter.
Figure 3A:
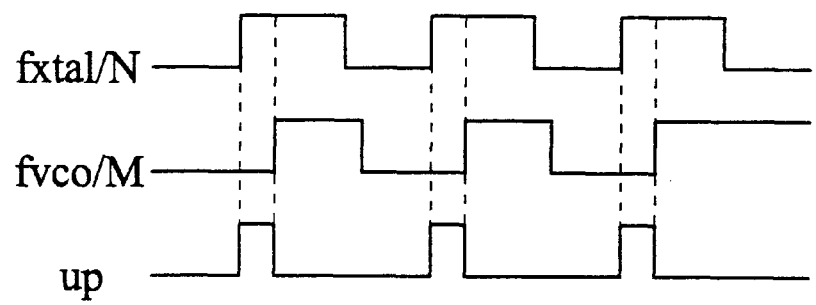
FIG. 3(a) illustrates the output from a phase frequency detector when the signal $f_{vco}/M$ lags behind the signal $f_{xtal}/N$.
Figure 3B:
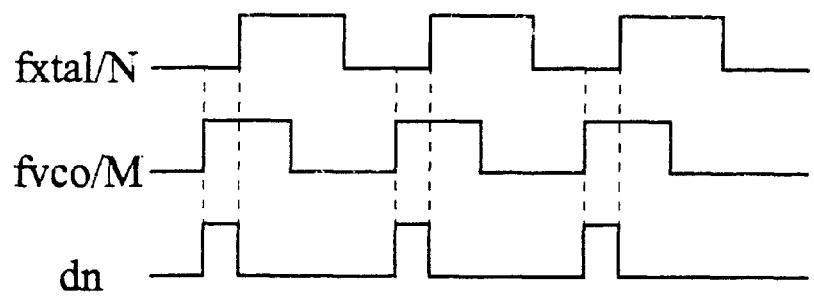
FIG. 3(b) illustrates the output from a phase frequency detector when the signal $f_{vco}/M$ is ahead of the signal $f_{xtal}/N$.
Figure 5:
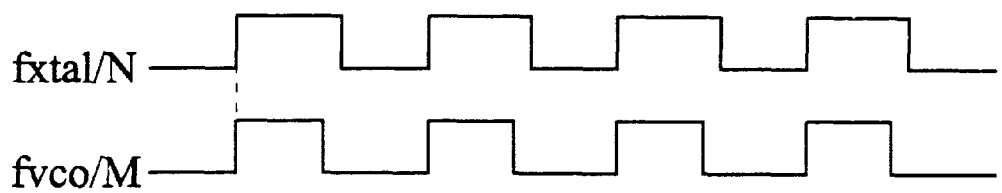
FIG. 5 illustrates the phase of the signal $f_{xtal}/N$ and that of the signal $f_{vco}/M$ when the phase-locked loop is in a phase-locked state.
Figure 6:
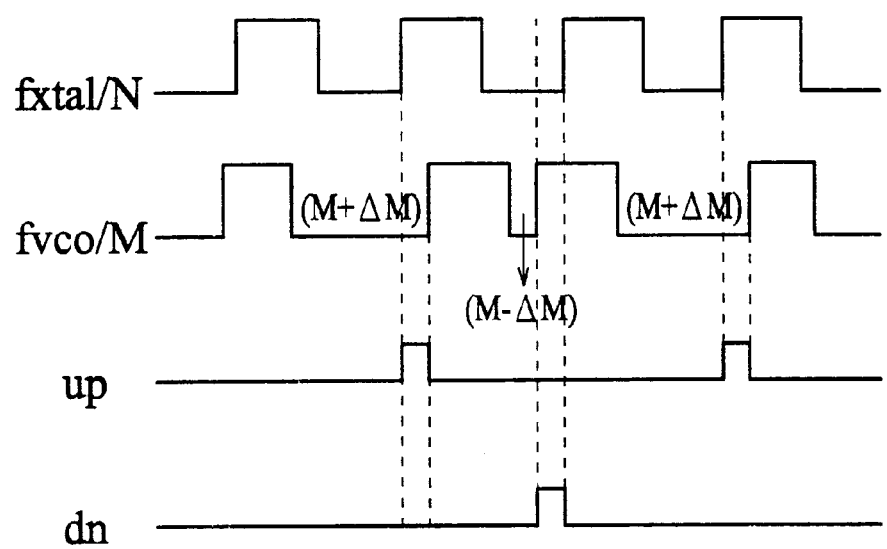
FIG. 6 illustrates the alternate generation of 'up' and 'dn' signals when M is changed to $(M+\Delta M)$ or $(M-\Delta M)$.
Figure 7:
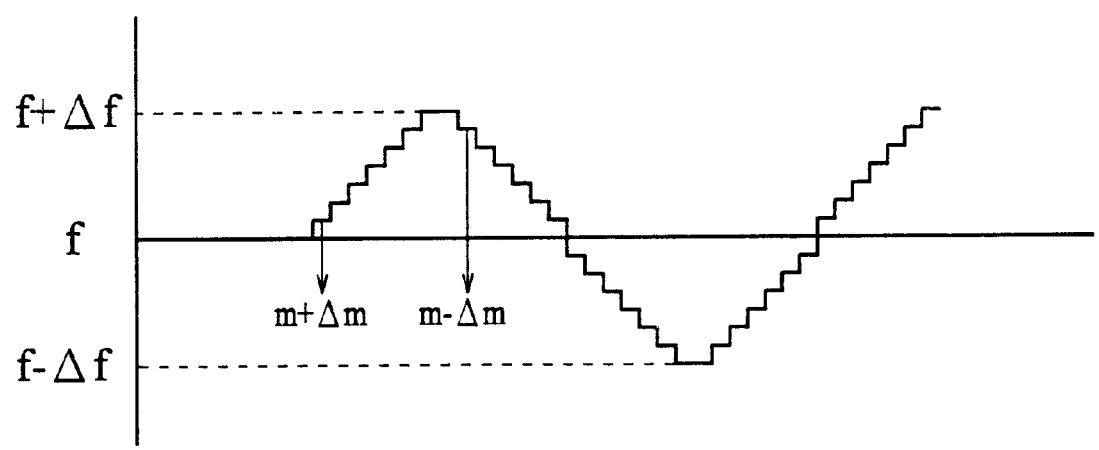
FIG. 7 illustrates the variation of $f_{vco}$ when the value of M varies.

If the phases of the signal $f_{xtal}/N$ and the signal $PH_0/M$ are in alignment and the clock counter 28 causes the switching unit 27 to switch to $PH_1$ at time $t_1$, then the first rising edge of the signal $PH_1$ appears at time $t_3$ while the first rising edge of the signal $PH_0$ appears at time $t_2$. As a result, the signal $f_{vco}/M$ lags T/8 behind the signal $f_{xtal}/N$. Under the situation, the phase frequency detector 23 outputs an 'up' signal, as illustrates in FIG. 3(a).

At a later time when a phase locked state has been achieved, the clock counter 28 causes the switching unit 27 to switch from $PH_1$ to $PH_2$, and the signal $f_{vco}/M$ then again lags T/8 behind the signal $f_{xtal}/N$. Similarly, the phase frequency detector 23 outputs an 'up' signal.

Subsequently, the clock counter 28 causes the switching unit 27 to switch from $PH_2$ to $PH_3$ and the phase frequency detector 23 outputs an 'up' signal. The situations while the clock counter 28 causes the switching unit 27 to switch from $PH_i$ to $PH_{i+1 \ mod \ 8}$ ($3 \leq i \leq 7$) are similar and a repetitious statement is thus omitted. In the aforementioned process, the clock signal $f_{out}$ (=$PH_7$) generated by the phase-locked loop 2 has frequency increasing with time.

On the other hand, in the process including one or multiple stages that the switching unit 27 switches from $PH_{i+1 \ mod \ 8}$ to $PH_i$ ($0 \leq i \leq 7$), the output clock signal $f_{out}$ has frequency decreasing with time. According to the above description, it is obvious that, by selecting the switching sequence of $PH_i$'s adequately, the frequency of the output clock signal $f_{out}$ can be controlled to vary increasingly and decreasingly, centering at some fixed frequency and not exceeding some fixed range. Frequency expansion can thus be achieved.

Moreover, the multi-phase voltage controlled oscillator 26 is a ring oscillator.

To sum up, the phase-locked loop 2 in accordance with the present invention utilizes a multi-phase voltage controlled oscillator 26 instead of a conventional voltage controlled oscillator, wherein a switching unit 27 is used to select the output signal of the multi-phase voltage controlled oscillator 26. The switching time of the switching unit is controlled by a clock counter 28. Therefore, frequency expansion can be achieved by a simple modification made to a conventional phase-locked loop.

Although the preferred embodiment of the invention has been illustrated and described, it will be obvious to those skilled in the art that various modifications may be made without departing from the scope and spirit of the invention defined by the appended claims.

What is claimed is:

1. A phase-locked loop having a multi-phase voltage controlled oscillator, comprising:

a divided-by-N counter which outputs a clock signal with frequency 1/N that of its input clock signal;

a divided-by-M counter which outputs a clock signal with frequency 1/M that of its input clock signal;

a phase frequency detector for receiving the output signal from said divided-by-M and the output signal from said divided-by-N counter, outputting a control signal that is determined by the phase difference and frequency difference between the two output signals;

a charge pump that receives the control signal outputted from said phase frequency detector;

a loop filter that is coupled to and cooperates with said charge pump to output a voltage signal, the variation of the voltage signal depending on the control signal;

a multi-phase voltage controlled oscillator that receives the voltage signal generated by said loop filter and outputs a plurality of clock signals of the same frequency and different phases, wherein one of the clock signals is used as the output clock signal of the phase-locked loop;

a switching unit that is connected between said divided-by-M counter and said multiphase voltage controlled oscillator for selecting a clock signal among the output clock signals from the multi-phase voltage controlled oscillator as the input signal of the divided-by-M counter; and a clock counter that generates a control signal for controlling the switching time of said switching unit.

2. A phase-locked loop having a multi-phase voltage controlled oscillator according to claim 1, wherein said multi-phase voltage controlled oscillator outputs P clock signals, P being equal or greater than 2, and if the oscillation period of said multi-phase voltage controlled oscillator being denoted by T, the phase difference between the adjacent clock signals being equal to T/P.

3. A phase-locked loop having a multi-phase voltage controlled oscillator according to claim 1, wherein said multi-phase voltage controlled oscillator is a ring oscillator.

\* \* \* \* \*